(12) United States Patent
Liu

(10) Patent No.: US 6,185,110 B1
(45) Date of Patent: Feb. 6, 2001

(54) MOUNTING FRAME FOR MOUNTING INPUT/OUTPUT DEVICE TO CONPACTPCI-BASED COMPUTER

(76) Inventor: Jin Liu, 5F, No. 168-1, Lien Chen Rd, Chung Ho, Taipei Hsien (TW)

( * ) Notice: Under 35 U.S.C. 154(b), the term of this patent shall be extended for 0 days.

(21) Appl. No.: 09/239,677

(22) Filed: Jan. 29, 1999

(51) Int. Cl.[7] ............................... H05K 5/03; H05K 7/18
(52) U.S. Cl. .................... 361/829; 361/683; 361/752; 361/753
(58) Field of Search ................................. 361/679, 681, 361/682, 752, 759, 801, 809, 829; 345/905, 87; 268/917

(56) References Cited

U.S. PATENT DOCUMENTS 4,964,018 * 10/1990 Mallory et al. .................. 361/681 X
5,268,816 * 12/1993 Abell, Jr. et al. ..................... 361/681
5,583,529 * 12/1996 Satou ................................ 361/681 X
6,002,582 * 12/1999 Yeager et al. ......................... 361/681

* cited by examiner

*Primary Examiner*—Jayprakash N. Gandhi
(74) *Attorney, Agent, or Firm*—Dougherty & Troxell

(57) ABSTRACT

A mounting frame adapted to mount an I/O device to a compactPCI-based computer includes an outer case member and an inner case member fixed together to define therebetween an interior space for accommodating and retaining the I/O device therein so as to form a modularized I/O system. The I/O module that is formed by fixing the I/O device between the inner case member and the outer case member is secured to the computer casing by means of a suitable device and electrically connected to an interface card arranged in the computer to define an easy-to-replace and easy-to-install modularized structure.

9 Claims, 6 Drawing Sheets

MOUNTING FRAME FOR MOUNTING INPUT/OUTPUT DEVICE TO CONPACTPCI-BASED COMPUTER

BACKGROUND OF THE INVENTION

1. Field of the Invention

The present invention relates generally to a mounting frame for an input/output (I/O) device, and more particularly to a mounting frame for mounting the input/output device to a CompactPCI-based industrial computer, CompactPCI being a registered trademark of the PCI Industrial Computer Manufacturers Group.

2. Description of the Prior Art

Besides the desktop-sized and notebook-sized personal computers that have been widely used in homes, schools and offices, the so-called industrial computers have also been widely used in the industry. Due to the severe environment that may be encountered in the industry, the industrial computers are designed to be more durable and more protected against the poor environment. In addition, the industrial computer also needs a more compact design. In other words, the industrial computer takes a smaller space. Currently, there are different specifications and standards for the industrial computers among which the so-called "CompactPCI" specifies a PCI-based computer system that is compatible with interface cards of PCI (peripheral component interconnect) specification, such as analog-to-digital converter card, digital control card, timer or counter, and relay control cards.

Due to the trend that the development of both the computer hardware and software are being in a graphics-based fashion to provide a more user-friendly computer environment and to help the user to operate the computer, the display device or I/O device of the computer system has to have the capability to display graphically in order to provide graphic output. Most industrial computer systems, however, are not equipped with built-in display or I/O device that is capable of displaying graphically or to provide graphic input/output function. Thus, an external graphics-based I/O device is needed in performing a graphic-fashioned I/O operation, such as a mouse or a touch pad. It is, however, sometimes not possible for an industrial computer to be connected with an external I/O device, due to the physical limitations imposed by the environment where the computer is located. Furthermore, externally connecting an I/O device to the computer may also be very inconvenient and the portability of the industrial computer may be lost.

On the other hand, some of the industrial computer systems and/or related electronic equipment have a built-in display device or I/O device, yet such a built-in display device or I/O device is usually of a proprietary construction which is difficult in maintenance and repairing. Sometimes in case of damage of parts of the device, due to the proprietary construction, the device may even need to be completely replaced. Furthermore, such a proprietary construction also has problems in upgrading the capability of the device, such as to upgrade the resolution, brightness and/or color of the display in order to meet a more severe requirement.

Thus, it is desirable to a provide a mounting structure for mounting an I/O device to a CompactPCI-based industrial computer and in particular a mounting structure for mounting an I/O device, such as liquid crystal display (LCD) and touch pad, to an industrial computer of the CompactPCI specification, so as to solve the problems discussed above.

SUMMARY OF THE INVENTION

Therefor, an object of the present invention is to provide a mounting structure for mounting an I/O device to a CompactPCI-based computer so that no connection with external I/O device is needed and the problems associated with connecting an external I/O device to the computer are completely eliminated.

Another object of the present invention is to provide a modularized I/O system adapted to be mounted to a CompactPCI-based computer so that the upgrading, maintenance and replacement of the I/O device may be facilitated.

To achieve the above objects, in accordance with the present invention, there is provided a mounting structure adapted to mount an I/O device to a CompactPCI-based computer. The mounting structure comprises (1) an outer case member comprising a substantially U-shaped body, having a bottom and two opposite and spaced side walls extending from the bottom to define therebetween a first interior space, the bottom having a user observing window formed thereon; (2) an inner case member sized to be snugly accommodated in the first interior space of the outer case member and fixed therein with first securing means, the inner case member comprising a substantially U-shaped body, having a bottom and two opposite and space side walls extending from the bottom to define therebetween a second interior space adapted to receive and hold therein the I/O device which comprises a user interface, the I/O device being fixed in the second interior space with second securing means in such a way to have the user interface of the I/O device corresponding to and observable through the user observing window of the outer case member so that a modularized I/O system is defined by the I/O device received in the inner case member which is in turn accommodated in the outer case member; and (3) anchoring means adapted to secure the I/O module to the CompactPCI-based computer.

To further understand the present invention, reference is made to the following detailed description of preferred embodiments of the present invention, as well as the attached drawings, wherein:

BRIEF DESCRIPTION OF THE PREFERRED EMBODIMENT

DETAILED DESCRIPTION OF THE PREFERRED EMBODIMENT

Figure 1:
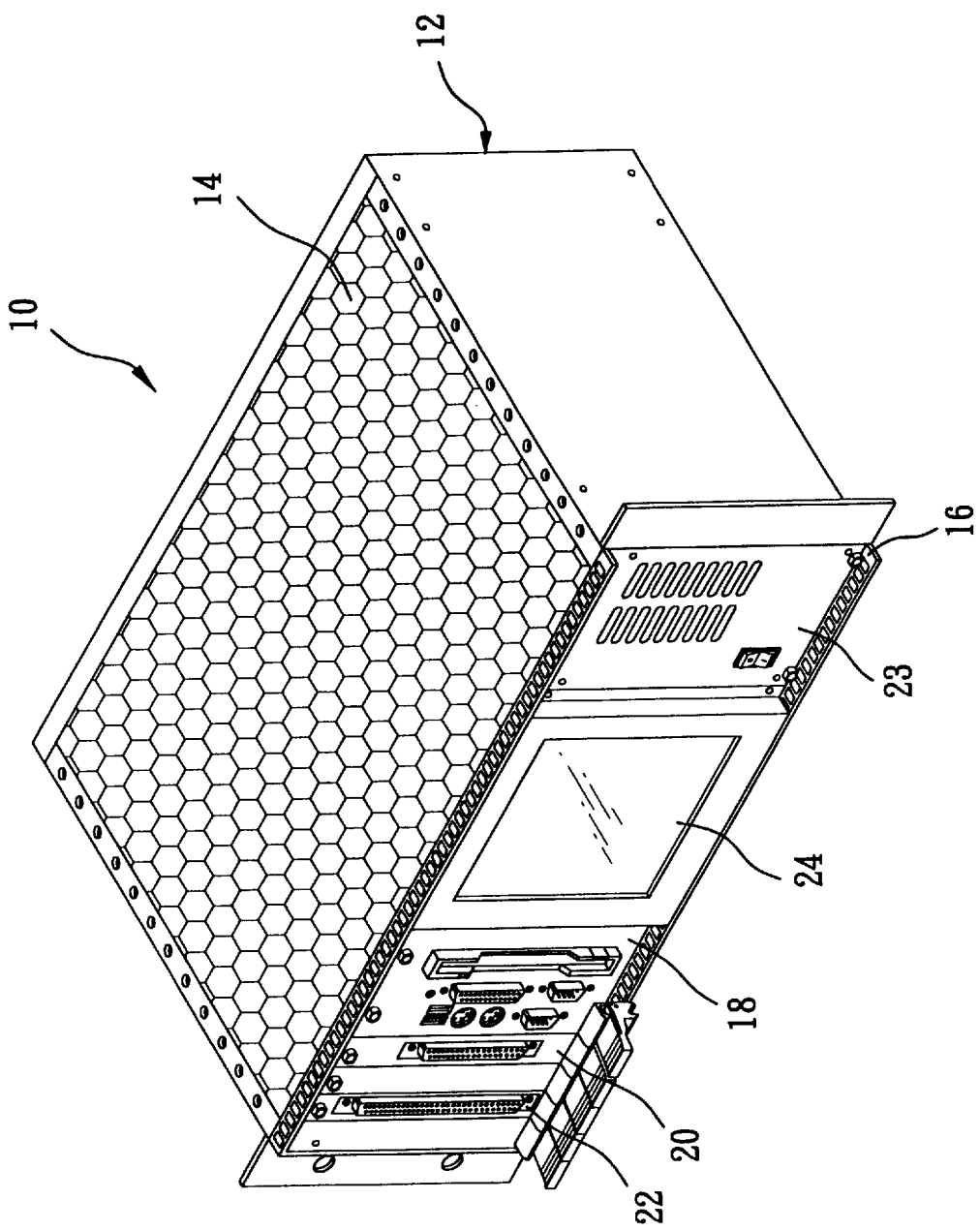
FIG. 1 is a perspective view showing a CompactPCI-based computer in which an I/O device mounting structure in accordance with the present invention is incorporated to mount an I/O module to the casing of the computer-sized, PCI-based computer.
Figure 2:
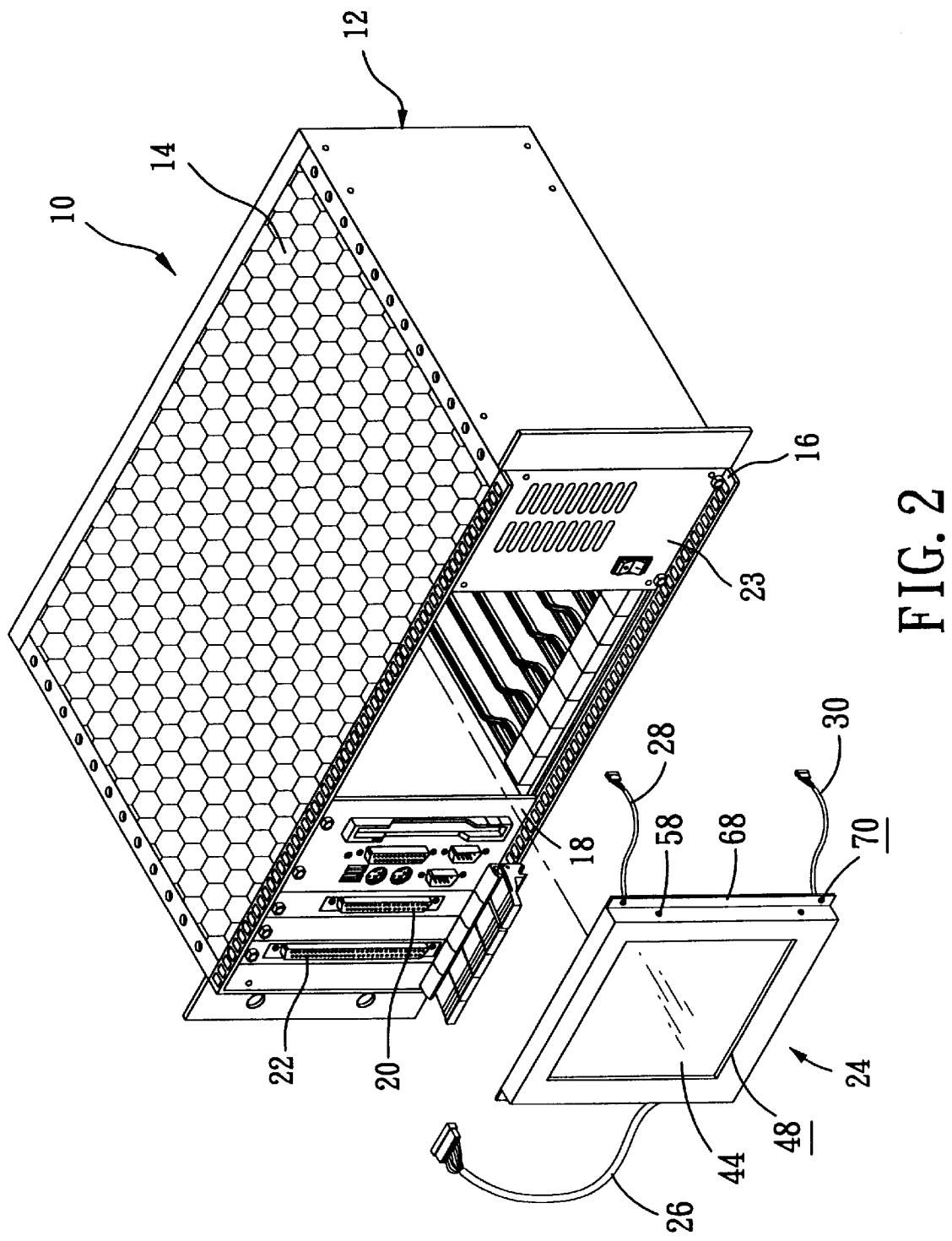
FIG. 2 is also a perspective view of the CompactPCI-based computer, showing the condition where the I/O module is detached from the computer casing.

With reference to the drawings and in particular to FIGS. 1 and 2, wherein a CompactPCI-based computer 10 is shown, the computer 10 in the embodiment illustrated is the so-called CompactPCI industrial computer. The computer 10 comprises a casing 12 having at least a top wall 14 and a bottom wall 16 defining therebetween a space in which parts of the computer 10 are fixed, including a main board assembly 18 and the associated connectors 20 and 22 and a power supply 23.

In accordance with the present invention, in the space between the top wall 14 and the bottom wall 16 of the casing 12, an I/O module 24 is mounted. The I/O module 24 is fixed to the front side of the computer casing 12 by means of suitable fasteners, such as screws, in a releasable manner. This will be further described hereinafter. The I/O module 24 comprises cables 26, 28 and 30 for connection with the computer 10 to provide signal/data and power transmission therebetween.

Figure 3:
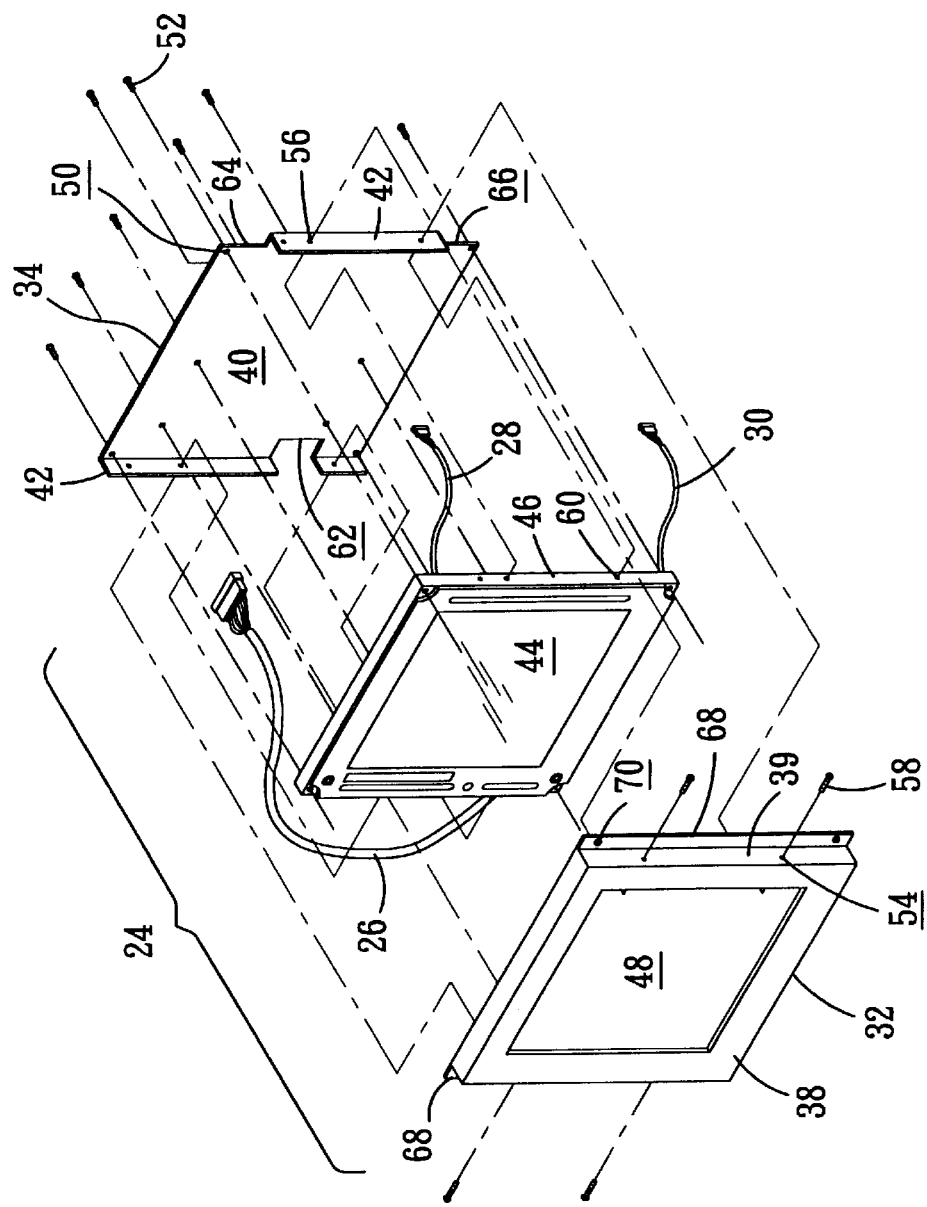
FIG. 3 is an exploded perspective view showing the I/O module in accordance with the present invention.
Figure 4:
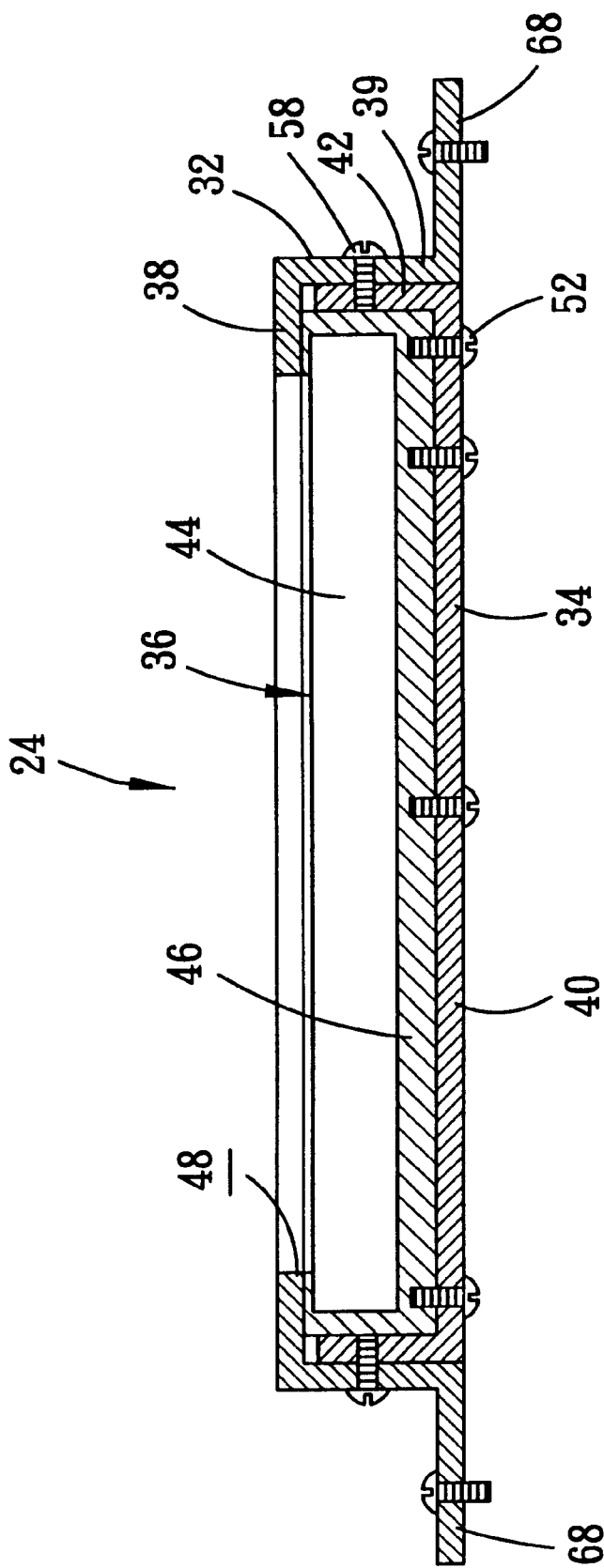
FIG. 4 is a cross-sectional view of the I/O module in accordance with the present invention.
Figure 5:
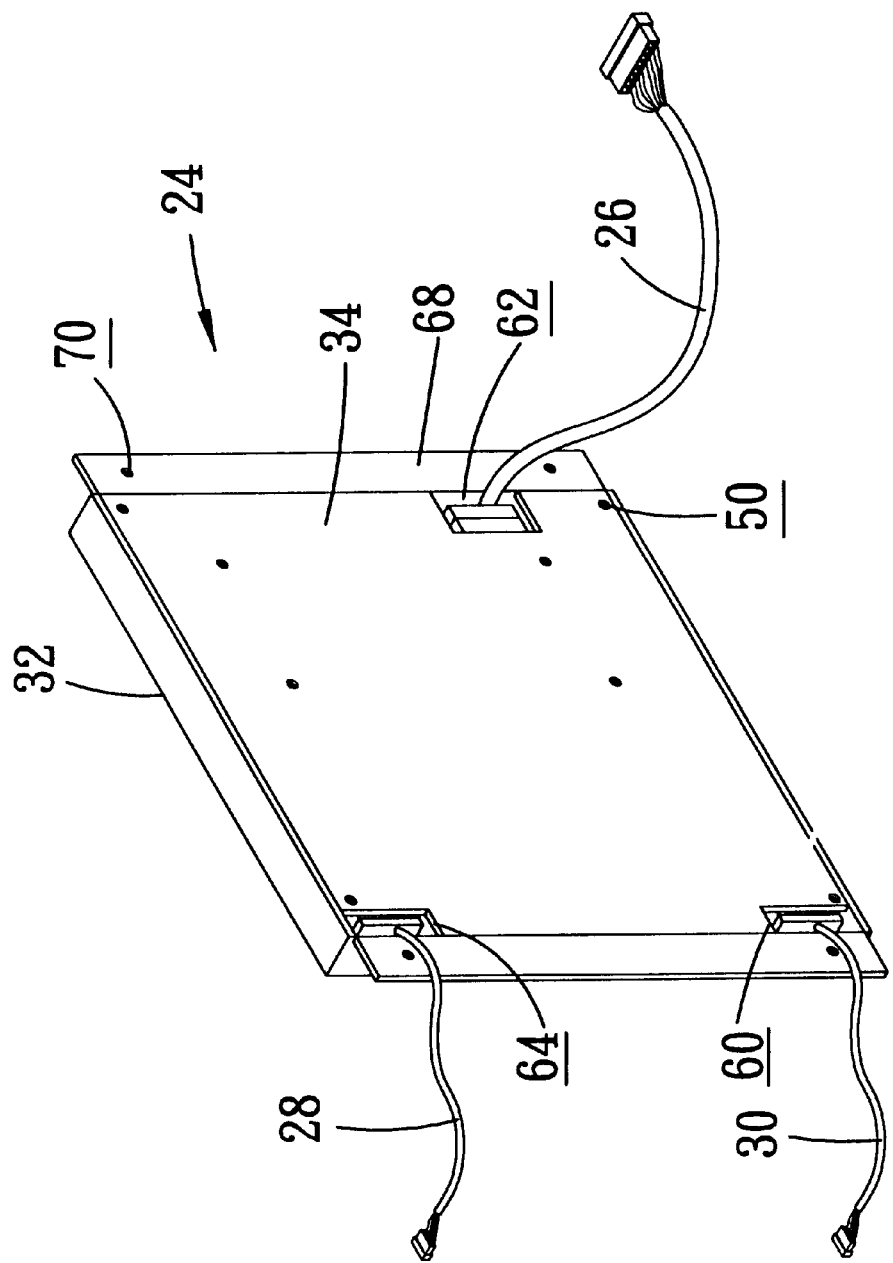
FIG. 5 is a perspective view of the I/O module in accordance with the present invention which is observed from the back side thereof.

With particular reference to FIGS. 3, 4 and 5, wherein the I/O module 24 in accordance with the present invention is shown, the I/O module 24 comprises a first, outer case member 32 and a second, inner case member 34 which are mounted together to retain an I/O device 36 therebetween so as to define a modularized I/O structure.

In accordance with a preferred embodiment of the present invention, the outer case member 32 comprises a body having a substantially U-shaped cross section which comprises a bottom 38 and two opposite and spaced side walls 39 extending from the bottom 38 to define therebetween an interior space for accommodating the inner case member 34 therein. Preferably, the side walls 39 are formed in such a way to completely surround the circumference of the bottom 38 as shown in the drawings so as to completely cover the circumference of the inner case member 34 accommodated in the interior space of the outer case member 32.

The inner case member 34 also comprises a body of U-shaped cross section, having a bottom 40 and two opposite and space side walls 42 extending from the bottom 40 to define therebetween an interior space to accommodate the I/O device 36 therein. Preferably, the size of the I/O device 36 is substantially corresponding to that of the interior space of the inner case member 34 so as to allow the I/O device 36 to be received in the inner case member 34 preferably in a snug manner and the play therebetween is small.

The I/O device 36 may comprise any suitable display device which is capable to display graphics and text (characters and digits). In the preferred embodiment of the present invention, the I/O device 36 comprises a liquid crystal display (LCD) element 44 with a touch pad function so that the user of the computer 10 may provide input signals to the computer 10 by touching a user interface of the LCD element 44 which may be the display surface of the LCD element 44, this being the touch pad function. The LCD element 44 is fixed in a casing 46.

The cables 26, 28 and 30 which are mentioned previously to connect the I/O module 24 to the computer 10 are actually connected to the LCD element 44 to provide the signal/data and power transmission between the LCD element 44 and the computer 10.

Such an LCD device is available in the market and is well known to those skilled in the arts of computer and display so that no further detail is needed herein.

In accordance with the present invention, the casing 46 of the I/O device 36 is positioned on the bottom 40 and between the side walls 42 of the inner case member 34 so as to have the LCD element 44 face the bottom 38 of the outer case member 32. To provide the computer user with a visual access to the LCD element 44, the bottom 38 of the outer case member 32 is formed with an observing window 48 which may simply comprise an opening. Alternatively, a light-transmitting film or cover plate (not shown) may be arranged within the window 48 to protect the LCD element 44.

The inner case member 34 may be provided with securing means to secure the I/O device 36 therein. In the embodiment illustrated, the securing means comprises a plurality of holes 50 (see FIG. 5) formed on the bottom 40 of the inner case member 34 through which screws 52 extend to engage threaded holes formed on the casing 46 of the I/O device 36 so as to securely hold the I/O device 36 in the inner case member 34.

Further, the outer case member 32 may also be provided with securing means to secure the inner case member 34 therein. In the embodiment illustrated, the securing means of the outer case member 32 comprises a plurality of holes 54 (see FIG. 3) formed on the two side walls 39 of the outer case member 32 and corresponding holes 56 provided on the side walls 42 of the inner case member 34 so that screws 58 may extend both holes 54 and 56 to secure the inner case member 34 in the outer case member 32. If desired, the casing 46 of the I/O device 36 may be provided with threaded holes 60 that correspond to the holes 56 on the inner case member 34 to be engaged by the screws 58 for further securing the I/O device 36 in the inner and outer case members 32 and 34.

The bottom 40 of the inner case member 34 is provided with several openings or cutouts 62, 64 and 66 for respectively receiving the cables 26, 28 and 30 that connect to the LCD element 44 to extend therethrough.

Although it is described to use screws 52 and 58 to secure the I/O device 36 and the inner and outer case members 34 and 32 together for forming the I/O module 24 of the present invention, yet it is quite obvious that other means may also be used to secure these parts together, such as guide rails or support frames together with suitable fasteners.

Moreover, to secure the I/O module 24 to the computer casing 12, the I/O device mounting structure in accordance with the present invention further comprises anchoring means for fixing the I/O module 24 to the computer 10. As shown in the drawings, the anchoring means comprises a flange 68 formed on each of the two side walls 39 of the outer case member 32, and sideways extending therefrom in directions opposite to each other. Each of the flanges 68 has at least one hole, preferably a plurality of holes 70, formed thereon to receive screws therein so as to be secured to the computer casing 12 or other computer parts inside the casing 12, as shown in FIG. 1. However, it should be noted that there are a variety of alternative ways for securing the I/O module 24 to the computer casing 12 which are known to those skilled in the art.

Figure 6:
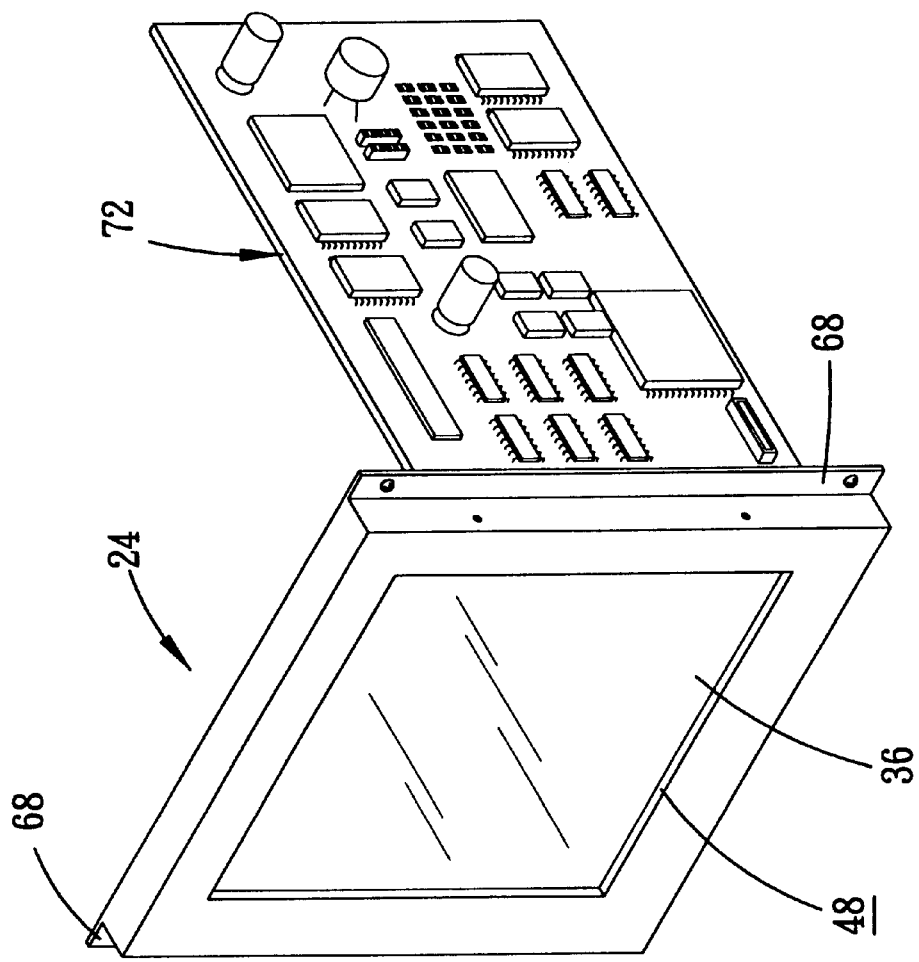
FIG. 6 is a perspective view showing an I/O module constructed in accordance with a second embodiment of the present invention in which a display interface card is directly connected to the I/O module.

As is known to those having ordinary skill in the computer art, a display interface card, such as the so-called VGA card, is usually provided in the computer to serve as the interface between the computer and the display device. In the embodiment of the present invention that is illustrated in FIGS. 2–5, the display interface card (not shown) is arranged inside the computer casing 12 and is connected to the I/O module 24 of the present invention by means of the cables 26, 28 and 30. Alternatively and as shown in FIG. 6 which illustrates a second embodiment in accordance with the present invention, the I/O module 24 comprises a display interface card 72 directly mounted thereto, preferably fixed to the bottom 40 of the inner case member 34 so that when the I/O module 24 is mounted to the computer casing 12, the display interface card 72 is positioned into the computer casing 12 and shielded and protected thereby. Such an arrangement allows the elimination or reduction of the length of the cables 26, 28 and 30 so that a more efficient management of the interior space of the CompactPCI-based computer 10 may be achieved.

Although the preferred embodiments of the present invention have been described to illustrate the present invention, it is apparent that changes and modifications in the specifically described embodiments can be carried out without departing from the scope of the invention which is intended to be limited only by the appended claims.

What is claimed is:

1. An industrial computer having a user interface input/output (I/O) module and comprising:
    a) a computer casing having a bottom wall and a spaced apart top wall, the bottom and top walls defining a side opening space therebetween; and,
    b) a user interface input/output (I/O) module attached to the computer casing in a fixed position in the side opening space between the bottom and top walls, the I/O module comprising:
        i) an outer case member having a substantially U-shaped cross-section with a front panel, and first side walls extending from at least two opposite sides of the front panel bounding a first interior space, the front panel having a user observing window;
        ii) an inner case member mounted in the first interior space, the inner case member having a substantially U-shaped cross-section with a rear panel and second side walls extending from at least two opposite sides thereof bounding a second interior space; and,
        iii) a user interface input/output (I/O) device mounted in the second interior space and between the front and rear panels, the I/O device having a display screen visible through the observing window.

2. The industrial computer as claimed in claim 1, further comprising a flange formed on each of the two side walls of the outer case member and extending in opposite directions, each flange having at least one hole to receive a fastener therein for securing the outer case member to the computer casing.

3. The industrial computer as claimed in claim 2, wherein the fastener comprise a screw.

4. The industrial computer as claimed in claim 1, further comprising screws which extend through holes in the rear panel of the inner case member and engage threaded holes formed on the I/O device.

5. The industrial computer as claimed in claim 1, further comprising first screws which extend through holes in the outer case member and engage holes in the inner case member.

6. The industrial computer as claimed in claim 5, further comprising second screws extend through holes formed in the inner case member and engage threaded holes on the I/O device.

7. The industrial computer as claimed in claim 1, wherein the I/O device comprises a liquid crystal display having a touch pad and wherein the user interface comprises a display surface of the liquid crystal display.

8. The industrial computer as claimed in claim 1, wherein the I/O module further comprises cables extending from the I/O device and openings in the inner casing member receiving the cables to enable the cables to extend therethrough.

9. The mounting frame as claimed in claim 1, further comprising an I/O device interface card fixed to and extending from the inner case member and which is in electrical connection with the I/O device.

* * * * *